United States Patent [19]

Yamagami et al.

[11] Patent Number: 5,368,884
[45] Date of Patent: Nov. 29, 1994

[54] METHOD OF FORMING SOLDER MASK

[75] Inventors: Yoshikazu Yamagami, Neyagawa; Akio Kashihara, Hirakata; Mamoru Seio, Takatsuki; Hisaki Tanabe, Yawata, all of Japan

[73] Assignee: Nippon Paint Co., Ltd., Osaka, Japan

[21] Appl. No.: 118,231

[22] Filed: Sep. 9, 1993

Related U.S. Application Data

[63] Continuation-in-part of Ser. No. 973,008, Nov. 5, 1992, abandoned.

[30] Foreign Application Priority Data

Nov. 6, 1991 [JP] Japan ................................ 3-289839
Apr. 21, 1992 [JP] Japan ................................ 4-100956

[51] Int. Cl.$^5$ ............................................. B05D 1/00
[52] U.S. Cl. ........................................ 427/96; 427/195; 427/198; 427/487; 427/522; 427/557; 427/558
[58] Field of Search ................. 427/96, 557, 558, 487, 427/522, 195, 198

[56] References Cited

U.S. PATENT DOCUMENTS

| | | | |
|---|---|---|---|
| 4,216,246 | 8/1980 | Iwasaki | 427/96 |
| 4,469,777 | 9/1984 | O'Neil | 427/96 |
| 4,567,062 | 1/1986 | Fan | 427/96 |
| 4,894,317 | 1/1990 | Maruyama et al. | |

FOREIGN PATENT DOCUMENTS 0286594 10/1988 European Pat. Off.
91/03770 3/1991 WIPO.

*Primary Examiner*—Shrive Beck
*Assistant Examiner*—Vi Duong Dang
*Attorney, Agent, or Firm*—Wenderoth, Lind & Ponack

[57] ABSTRACT

The present invention has as its object providing a solder mask which permits high density mounting, is suitable for protecting conductor circuits, particularly has mask thickness on the circuit parts and each edge part of the circuits which make almost no difference from those on other parts, and is excellent in electrical insulation, heat resistance and solvent resistance.

This invention provides a method of forming a solder mask for printed circuit boards, using any powder paint which is curable by both irradiation of ultraviolet ray and heat, comprising:

(1) a step of coating the powder paint on a printed circuit board, while holding it at a temperature higher than a softening point of the powder paint,
(2) a step of irradiating ultraviolet rays thereon through a pattern mask,
(3) a step of making development with a medium which dissolves the region not irradiated by ultraviolet rays and,
(4) a step of completely curing the coating part developed on the printed circuit board at a temperature higher than the curing temperature of the powder paint.

10 Claims, No Drawings

METHOD OF FORMING SOLDER MASK

This application is a continuation-in-part of now abandoned application, Ser. No. 07/973,008, filed Nov. 5, 1992.

BACKGROUND OF THE INVENTION

1. Field of the Invention

The present invention relates to a method of forming a solder mask on a printed circuit board.

2. Description of the Prior Art

On a printed circuit board, a solder mask is formed on conductor circuits, for ensuring insulation between the conductor circuits for protecting the conductor circuits from peeling or oxidation, or for preventing unnecessary solder from sticking on the conductor circuits at the time of soldering operation.

As a method of forming this solder mask, screen printing process is typically well-known. However, the screen printing process provides substantially low resolution. It develops such phenomena as blur, pinholes, bleed, spread or the like, resulting in failure to deal with diminishing distances between conductor circuits or increasing densities of the printed circuit board that has taken place concomitant with the recent high density mounting of circuits.

Under this circumstances a method of forming the pattern by the photographic process, after forming a coating by applying a photosensitive resin composition by spraying or by use of a roll coater or curtain coater and so forth, has begun to be adopted (Japanese Patent Laid-Open Publication Nos. Sho 63-286841, Hei 2-28651 and Hei 2-77749).

However, in the above technique, since a liquid photosensitive resin composition having a relatively low viscosity is used as the paint for forming the solder mask, the thickness of the solder mask is thin, before the liquid has been dried on the circuit part and the circuit edge part. On this account, a solder mask thickness enough to have proper electric insulation, heat resistance and resistance to organic solvents, etc., can not be obtained. If the substrate has any through-holes, the photosensitive composition flows into these through holes and gives rise to various problems.

In order not to arise coating defects, such as sagging and flowing even when thickly coated, there has been proposed an electrostatic powder coating method using as an etching resist for forming printed circuits (Japanese Patent Laid-Open Publication No. Sho 63-246890), although outside the field of solder mask. However, in this method, a powder coating composition is coated on a conductive substrate of which one side is overly covered with copper. It is therefore difficult to apply on the printed circuit board in which insulating portions and electroconductive portions are mixed, because this printed circuit board is essentially insulated.

Also, the resist which is described in Japanese Laid-Open Publication Sho-63-246890 has poor photosensitivity to photo-initiated radical reaction and therefore difficult to be used as solder mask, because the powder coating composition suggested in this publication only contains solid thermoplastic resin having 0.5 to 5 polymerizable unsaturated groups in a molecular weight of 1,000. Since the crosslinking reactions in the powder coating composition only proceed through the polymerizable unsaturated groups, heat resistance, chemical resistance and durability are so poor that it is difficult to apply it to the solder mask.

SUMMARY OF THE INVENTION

The present invention has as its object providing a solder mask which permits high density mounting of wiring which is suitable for protecting conductor circuits, which has a thickness, particularly on the circuit parts and circuit edge parts, little different from that on other parts (for example, on the insulating substrate) and which has excellent electrical insulation, heat resistance and solvent resistance. It is also its object to provide a solder mask which will not block any through holes and which protects mini via-holes by tenting. Its another object is to provide a method of using masking material at high efficiency.

Accordingly, the invention provides a method of forming a solder mask on printed circuit boards, using powder paint which is curable by both irradiation of ultraviolet rays and heat. This method comprises:

(1) a step of coating the powder paint on a printed circuit board, while holding it at a temperature higher than a softening point of the powder paint but lower than its curing temperature, (2) a step of irradiating ultraviolet rays thereon through a pattern mask, (3) a step of making development with a medium which dissolves the region not irradiated by ultraviolet rays and, (4) a step of completely curing the coating part developed on the printed circuit board at a temperature higher than the curing temperature of the powder paint.

Also, this invention provides a method of forming a solder mask on printed circuit boards using powder paint which is curable by both irradiation of ultraviolet rays and heat, comprising:

(1-a) a step of putting on a printed circuit board 1–1000 mg/dm$^2$ of an organic solvent whose contact angle with the conductor and the insulating substrate is smaller than 20 degrees, (1-b) a step of applying on a printed circuit board having the organic solvent the powder paint composition which gives an SP value less than 3 between it and the organic solvent, (1-c) a step of making the coated powder paint into a contiguous coating by controlling a temperature of the printed circuit board to a temperature higher than a softening point of the powder paint but lower than its curing temperature, (2) a step of irradiating ultraviolet rays thereon through a pattern mask, (3) a step of making development with a medium which dissolves the region not irradiated by ultraviolet rays and, (4) a step of completely curing the coating part developed on the printed circuit board at a temperature higher than the curing temperature of the powder paint.

The method of forming a solder mask of this invention is used not for forming an organic coating on a substrate which is conductive all-over its surface, but for forming a solder mask on an ordinary printed circuit board which has electroconductive circuits formed from an electroconductor metal, such as copper, on the insulating substrate.

The conventional method of forming a solder mask by photographic process, as mentioned above, includes a step of applying a liquid photosensitive resin composition on a printed circuit board by use of an open screen, sprayer, roll coater, curtain coater or the like. However, this method is inadequate, because it is difficult to form the coating thicker and it is impossible to provide a coating of uniform thickness and containing no bubbles, because of the low viscosity of the paint and its large solvent content. In addition, the conventional method is decisively inadequate, because the interiors of through-holes and mini via-holes are undesirably blocked. Thus because of low viscosity of the paint, high pressure and high degree of atomization, parts of the through-holes and mini via-holes are often plugged with paint or ink. Such plugged parts can no longer be adequately cleared by the later developing treatment. If it is tried to further proceed with the development, until the plugged holes are cleared, a developing time still longer than that is necessary and sufficient for forming a nondefective image needs to be taken. Then the solder mask is excessively subjected to the developing treatment, yielding a defective mask.

According to this invention, a powder paint, which normally has a mean particle size of 20-150 $\mu$m, is used, its viscosity is high, when melted, as compared with liquid paints or inks, and the coating pressure is low and so forth. On this account, bridges of the powder paint develop over through-holes and mini via-holes, so that the insides of the through-holes are not blocked by the paint. Therefore, the through-holes are completely opened under the normal conditions of development, yielding a solder mask free of defects at the image forming parts. Besides, with regard to mini via-holes, the bridged contiguous coating of the powder paint is set by the irradiation of ultraviolet rays through a pattern mask. It is not dissolved by the development, but remains fully covering the holes. Moreover, according to this invention, in addition to the very high efficiency of coating on the printed circuit board, the powder paint composition which has failed to stick thereon is reclaimed. Accordingly, a mask of a thick coating excellent in characteristics as a solder mask, namely characteristics such as electric characteristics, heat resistance and solvent resistance and plating solutions and so on, is obtained at a high yield.

DETAILED DESCRIPTION OF THE INVENTION

One aspect of this invention encompasses the above mentioned four steps (1), (2), (3) and (4).

The step (1) is coating the powder paint on the printed circuit board, while holding its temperature higher than the softening point of the powder paint but lower than its curing temperature. The printed circuit board is an insulator as a whole, so that electrostatic powder coating which requires electroconductivity is hindered by repulsion of the paint particles. The present inventors have discovered a fact that even on an insulating substrate, if warned to such an extent that the powder paint will melt, when fixedly coated thereon, contiguous coating may be formed, without causing repulsion by the paint particles. Besides, it has been found out that at this time, if the holes had diameters smaller than 0.5 mm (500 $\mu$m), the powder paint forms bridges at their opening parts, thereby thwarting the entry of the powder paint into the through-holes. As hereabove mentioned, the step (1) is important to this invention. For the equipment for heating the printed circuit board at this time, any heating device being normally in industrial use is proper a hot air drier, infra-red drier, gas oven, heat plate or the like may be used. The "softening point" herein mentioned refers to a temperature at which part of the powder resin composition melts or starts its molecular movement, which is actually indicated by Ts, when the temperature is raised at a rate of 6° C./min under a load of 20 kg/cm$^2$ in a flow tester or a temperature at which the resin composition forms a single phase uniform in appearance, while keeping the irregular stress distribution therein. Further, for the powder coating equipment, such well-known devices as a powder sprayer, electrostatic powder sprayer, fluidized dipping apparatus or the like may be utilized. From the standpoint of uniformity of the thickness of the coating formed and the safety, the powder sprayer is recommended.

If necessary, a step of leveling the powder paint coated on the printed circuit board, with its temperature held higher than the softening point of the powder paint but lower than the curing temperature of the powder paint, may be provided. This step is conducted for obtaining an adequately contiguous coating, without making unexposed parts undissolved by the developer. For this purpose, the heating temperature of the printed circuit board to be held should be regarded important. In this step also, the above-described heating device can be used. It may be same as or different from the preheater.

The step (2) is for irradiating ultraviolet rays on the coating through a pattern mask. This process is well-known as a way of forming images by photography. Normally, high or low pressure mercury lamps, xenon lamps, etc., are utilized. But the lamps are not limited to them. If importance is attached to the exposure sensitivity and the resolution in this step, in the contiguous coating, the photo-initiation reaction should be performed in its somewhat fluid state rather than in its completely stationary state. Thus the irradiation of ultraviolet rays should desirably be made, with the pattern mask kept out of touch with the coating, while it is held in the state of containing some liquid matter or at a temperature higher than the softening point of the powder paint but lower than its curing temperature. In this instance, the exposure should desirably be made with an exposer which produces parallel light beams.

If the powder paint composition contains any crystalline resins, the resins' crystalline orientation hinders penetration of ultraviolet rays, affecting the sharpness of the image at the time of development. In that event, the impedimenta to the penetration of ultraviolet rays may be precluded by quenching the substrate, to make it difficult for the crystalline resins to be oriented, before they are oriented. Thus this invention also includes the step of quenching the substrate as an additional process. The method of quenching is not particularly limited, but spraying of liquid is not desirable, because defective image will be produced in that way. Passing the printed substrate through a cool wind or placing it on a plate being in contact with any cooling medium and such other methods are preferable. Particularly desirable is using a plate made of metal which permits the heating and the cooking to be switched by changing the medium.

The next step (3) is a step of making the development with a medium which dissolves the region not irradiated by ultraviolet rays. As the developer to use, it is proper to choose a medium with which the reaction products formed from the radicals produced through decomposition which has been induced by irradiation of ultraviolet rays in the presence of some photosensitizers and photopolymerization initiators are not dissolved, but the powder paint composition is dissolved. Such usable media generally in use include organic solvents, such as trichloroethane, methylene chloride, xylene, toluene, ethylene glycol monoethyl ether, ethyleneglycol dimethyl ether, ethylene glycol monoethyl ether acetate, diethylene glycol monobutyl ether, diethylene glycol dimethyl ether and like; and alkaline aqueous solutions, such as sodium carbonate, sodium methasilicate and like, but are not restricted to these solvents.

The step (4) is a step of the so-called curing reaction in which the printed circuit board on which the coating is left after its development is held at a temperature higher than the curing temperature, preferably 140°–180° C., for 15–60 min. This step is a process for forming coating tough enough to discharge its function as a solder mask, which requires a high enough temperature and a long enough time for the functional radicals which undergo the curing reaction under heating to undergo adequate reaction. For this purpose, with functional radicals which undergo self-condensation reaction like epoxy group and amine or carboxyl group and acid anhydride or hydroxyl group and carboxyl or methylol group, amine, isocyanate or like groups, keeping heating at 140°–160° C. for about 30 min is proper. Raising the temperature over that at which the insulating substrate will deform should be avoided.

The present inventors have also found that the step (1) in the above mentioned solder mask forming process can be replaced by the following steps (1-a), (1-b) and (1-c), whereby the same technical effects are obtained. The step (1-a) is a step in which an organic solvent layer is formed on the surfaces of the insulating substrate and the conductors by applying an organic solvent on the surface of the printed circuit board. The amount of the organic solvent to be applied should be controlled to have 1–1000 mg/dm$^2$ of an organic solvent layer formed on the surface of the printed circuit board. The controlling of the amount of the organic solvent on the printed circuit board may be done also by drying some of it after its application. The amount of the organic solvent on the printed circuit board may be determined from the weight difference before and after its application.

The organic solvent usable according to this invention should desirably gives contact angles smaller than 20 degrees with the conductor and the insulating substrate. Although the cause is not certain, such an organic solvent notably reduces the surface free energy of the printed circuit board. Accordingly, it forms a uniform and stable organic solvent layer not only on a flat part of the insulating substrate but on the projected part forming a border between the insulating material and the conductor, as at the corner part of wiring. In contrast, organic solvents which show contact angles larger than 20 degrees with the conductor and the insulating substrate does not adequately reduce the surface free energy of the printed circuit board. Accordingly, no uniform and stable organic solvent layer will be formed with them all over the surface of the printed circuit. Such solvents are therefore undesirable. The contact angles of the organic solvent with the conductor and the insulating substrate are readily measurable with use of a FACE automatic contact angle meter (manufactured by Kyowa Kaimen Inc.).

Actual examples of organic solvents mentioned as preferably usable according to this invention include aromatic hydrocarbons such as toluene and xylene; alcohols such as ethanol, propanol and butanol; ethers such as methyl phenyl ether and tetrahydrofuran; ketones such as methyl ethyl ketone and methyl isobutyl ketone; esters such as ethyl acetate and butyl acetate; ether alcohols such as ethylene glycol monomethyl ether, ethylene glycol monobutyl ether and propylene glycol monopropyl ether; and their derivatives (acetic acid esters), and the like. With a view to controlling by drying the amount of the organic solvent held on the printed circuit board, use of organic solvents which show relatively slow rate of evaporation is desirable.

For the method of applying such organic solvents, use of a roll coater, spraying, brushing and dipping and so forth may be mentioned, but it is not limited to them.

Then in the next step (1-b), the powder paint is applied on the printed circuit board having an organic solvent layer thereon in an amount of 1–1000 mg/dm$^2$.

The powder paint used according to this invention shall give a $\Delta$SP value less than 3 between it and the aforementioned organic solvents (actually, the organic solvent is selected, with the $\Delta$SP between it and the powder paint composition taken into account). The $\Delta$SP value used here means the absolute value of the difference between respective solubility parameters, the solubility parameter in turn signifying the cohesive energy density of the pertinent material. The solubility parameter $\Delta$sp of the powder paint composition used in this invention is obtained by experiment. Actually, it may be determined by a formula:

$$\Delta sp = (V_{ml} \times \Delta_{ml} + V_{mh} \times \Delta_{mh})/(V_{ml} + V_{mh})$$

(where $V_{ml}$ represents the molecular volume of any low SP solvent at its clouding point; $V_{mh}$, the molecular volume of any high SP solvent at its clouding point; $\Delta_{ml}$, the solubility parameter of any low SP solvent; and $\Delta_{mh}$, the solubility parameter of any high SP solvent), which appears in K. W. Suh and J. M. Corbett: Journal of Applied Polymer Science, Vol. 12, p. 2359 (–68). The molecular volume V of each organic solvent at its clouding point is determined from its tolerance.

On the other hand, the solubility parameter of any organic solvent is determined by the calculation formula and experimental value of its coupling energy, but generally used are the numerical values which appear in Polymer Handbook, John Wiley & Sons, compiled by J. Brandrup and B. U. Immergut. Accordingly, the $\Delta$SP is the absolute value of the difference between the solubility parameter of the powder paint composition determined as hereabove-described and the solubility parameter of the pertinent organic solvent which appears in the literature.

When the $\Delta$SP value between the powder paint composition and the organic solvent is lower than 3, the affinity of the powder paint particles to the organic solvent is strong; therefore, the powder paint particles are not repelled from the surface, when applying the powder paint. Accordingly, it is possible to contiguously pile the powder paint particles adequately thick one upon another on the surface of the printed circuit board and hold them thereon. In contrast, if the $\Delta$SP value between the powder paint composition and the organic solvent is higher than 3, the affinity of the powder paint particles to the organic solvent is weak, causing the phenomenon of the powder paint particles being repelled from the surface, when applying the powder paint thereon to take place. Consequently, it is impossible to pile the powder paint particles adequately thick one upon another on the printed circuit board. On this account, it is difficult to form a contiguous coating free of bubbles.

In the step (1-b) of applying the powder paint component by way of powder coating, it is desirable to keep the amount of the organic solvent held on the surface of the printed circuit board at 1–1000 mg/dm$^2$. If the amount of the organic solvent held on the surface of the printed circuit board is smaller than 1 mg/dm$^2$, the affinity between the substrate and the powder paint composition is weak. Accordingly, uniform and adequately thick coating can not be produced on the printed circuit board, with the result that bubbles tend to remain and that fine wiring circuits are less fully embedded. Such a coating does not provide satisfactory function as a solder mask. If the amount of the organic solvent held on the surface of the printed circuit board is larger than 1000 mg/dm$^2$, its sagging occurs on the surface of the printed circuit board, thus detracting from formation of uniform film of organic solvent. As a result, thick coating can not be maintained on the circuits and the circuit corner parts, thus the coating obtained failing to assure its satisfactory function as a solder mask.

The step of this invention of applying the powder paint component on the printed circuit board may be performed, using a printed circuit board heated to some degree under its curing temperature. In that way, the paint composition's coherency can be further improved. For this purpose, the printed circuit board should be heated to 5°–90° C., preferably 15°–80° C. and more preferably 30°–80° C.

The powder paint composition used in this invention should preferably be applied on the printed circuit board by fluidized dipping, electrostatic fluidized dipping, spraying or electrostatic spraying or like coating methods, but the usable method is not limited to them. In this process, the powder paint composition should be coated on the surface of the printed circuit board preferably to a coating thickness of 10–60 μm, more preferably a coating thickness of 20–50 μm.

After forming a layer of the powder paint composition on the surface of the printed circuit board, the solder mask is formed through the steps already described in the previous invention, that is, a step of turning the layer of the powder paint composition into a contiguous coating, a step of irradiating ultraviolet rays thereon through a pattern mask, then, a step of making the development with a medium which dissolves the region not irradiated by ultraviolet rays and a step of holding the printed circuit board at a temperature higher than the curing temperature of the powder paint.

As the powder paint used according to this invention which is curable by both irradiation of ultraviolet rays and heat should desirably be powder paint compositions consisting of (i) 30–90 parts by weight of resins with their number average molecular weights larger than 1000 and being solid at the normal temperature, which have 0.1–3 radically polymerizable unsaturated groups and 0.1–5 functional radicals which undergo curing reaction under heating in those having a number average molecular weight of 1000, (ii) 70–10 parts by weight of compounds with their number average molecular weights smaller than 1000 and being solid at the normal temperature, which have a plurality of radically polymerizable unsaturated groups and (iii) 0.1–10 parts by weight of photopolymerization initiator in proportion to 10 parts by weight of the total of the amounts of (i) and (ii). Besides, resins with their number average molecular weights larger than 1000 and being solid at the normal temperature, which have 0.1–3 radically polymerizable unsaturated groups in those having a number average molecular weight of 1000 may be added. In this instance, the resins to be added should be less than 50% by weight of the total resin components. Further, the so-called curing and bridging agents, which can undergo curing reaction under heating with the functional radicals the resin component of (i) has may be added. In this instance, the molecular weight of the curing and bridging agents is not particularly limited, but they should desirably be in solid state at the normal temperature. As such curing and bridging agents, for example, polyepoxy, polyisocyanate, polycarboxylic acid, polyamine and like compounds are available. Their amounts to be added should desirably be at the same concentrations as those of the functional radicals, but are not necessarily bound by this condition. The resins of (i) need to have number average molecular weights larger than 1000. If they are smaller than 1000, the final molecular weights are not adequately large, however large extent the photocuring reaction or the curing reaction has proceeded. Then they are dissolved by the developer or have inadequate heat resistance, resistance to solvents and durability. In addition, because of the rapid advancement of curing reaction of low molecular weight compounds, the shrinkage of coating is large and the resultant internal stress tend to give rise to defective solder mask with cracks and pinholes and so on. The resins need to have 0.1–3 radically polymerizable unsaturated groups in those having a number average molecular weight of 1000. If their number is less than 0.1, the photocuring reaction induced by exposure is insufficient, resulting in inadequate resistance to the developer and so failure in forming the necessary image. If the number of polymerizable unsaturated radicals is in excess of 3 in those having a number average molecular weight of about 1000, coating shrinkage is large, producing cracks and pinholes. Further, such resins need to have 0.1–5 functional radicals which undergo curing reaction under heating in those having a number average molecular weight of 1000. In this instance, if they have less than 0.1 radicals, the curing of the resins by the later curing is inadequate, resulting in insufficient resistance to soldering through, plating and so forth. Conversely, if their numbers is in excess of 5, coating shrinkage occurs, producing defective masks only. In the similar vein, these resin components need to be used in 30–90 parts by weight.

The resin components with their number average molecular weights larger than 1000 and being solid at the normal temperature, which have 0.1–3 radically polymerizable unsaturated groups and the resin components with their number average molecular weights larger than 1000 and being solid at the normal temperature, which have 0.1–3 radically polymerizable unsaturated groups and 1–5 functional radicals which undergo curing reaction under heating in those having a number average molecular weight of 1000, are actually those having as the radically polymerizable unsaturated groups acryloyl, methacryloyl, cinnamoyl and like groups, which are polymerized by ultraviolet rays. The functional radicals which simultaneously undergo curing reaction under heating include, e.g., epoxy group, epoxy and carboxyl, epoxy and amino, epoxy and imino, and like combinations of groups; hydroxyl group and blocked isocyanate, amino group and blocked isocyanate, carboxyl group and blocked isocyanate; methylol group, methylol group and hydroxyl group; alkoxy methylol group, alkoxy methylol group and hydroxyl group and like groups or combinations of groups which the resins have within the same molecules or between different molecules. These functional radicals may be introduced simultaneously as synthesizing such resin components or they may be introduced by addition reactions, after the resin components have been synthesized. Actually illustrating the resin synthesis, in the case of acrylic resin being the substrate, acrylic resins having epoxy radicals in their side chains are synthesized by mixing under heating in the presence of some polymerization initiators monomers having glycidyl radicals, e.g., glycidyl acrylate, glycidyl methacrylate and other monomers, if necessary, in any solvents which are capable of dissolving the resins formed. Thereafter, the reaction is advanced with addition of monomers having carboxyl and/or hydroxy radicals, e.g., acryl acid, methacryl acid, hydroxy methyl acrylate, hydroxy methyl methacrylate, hydroxy propyl acrylate, hydroxy propyl methacrylate and so on, while adding polymerization inhibitors for leaving radically polymerizable unsaturated groups intact or supplying oxygen. The object substances may be obtained by reversing the steps. Thus monomers having carboxyl and/or hydroxy groups and other monomers, if necessary, are polymerized first, thereby synthesizing acrylic resins having carboxyl and/or hydroxyl groups in their side chains. Subsequently, glycidyl acrylate, glycidyl methacrylate, glycidyl cinnamate and like compounds are reacted with such resins in the presence of polymerization inhibitors and/or oxygen. At this time by using numbers of moles of glycidyl acrylate or glycidyl methacrylate, glycidyl cinnamate and like compounds which are smaller than the number of moles of carboxyl and hydroxyl groups combined, resins provided with both radically polymerizable unsaturated groups and functional radicals which undergo reactions under heating may be obtained. By removing the solvents used for polymerization after ending the reaction by way of reduced pressure distillation, with use of a spray drier or a like method, acrylic resins being in solid state at the normal temperature, which have radically polymerizable unsaturated groups and functional radicals which undergo curing reaction under heating may be obtained.

When polyester resins are used as substrate, carboxyl and/or hydroxyl groups are left in their molecules through dehydrating condensation reaction conducted in the well-known way; thereafter, the products are reacted with acrylate or methacrylate monomers having functional radicals which react with these functional groups, e.g., glycidyl acrylate, glycidyl methacrylate, acryloyl isocyanate, methacryloyl isocyanate, acrylic acid chloride, methacrylic acid chloride and so on and glycidyl cinnamate. At this time, by reacting with such resin molecules acrylate or methacrylate monomers in number of moles smaller than that of the carboxyl and/or hydroxyl groups which have been left in their molecules, radically polymerizable unsaturated groups and functional radicals which coincidentally undergo curing reaction under heating may be introduced into the resins.

In the case where the substrate is epoxy resin, epoxy resins having functional radicals which undergo curing reaction under heating with radically polymerizable unsaturated groups may be obtained by reacting acrylate or methacrylate base monomers having carboxyl or hydroxy ethyl acrylate, hydroxy methyl methacrylate, hydroxy propyl acrylate and so on, with resins, for example those synthesized from bisphenol A and epichlorohydrin by the well-known method or glycidyl etherized resins of phenol novolak or cresol novolak by utilizing their terminal epoxy radicals, or by reacting therewith acrylic acid chloride, methacrylic acid chloride, acryloyl isocyanate or methacryloyl isocyanate and so on by utilizing hydroxyl groups in their molecules. In this instance, in view of their performance as a solder mask, resins having large number of epoxy radicals left as in the latter are more preferable.

Besides, resins which meet the requirements intended to have may be obtained by denaturing various resins hitherto well-known.

Since these resins are main raw materials of powder paints, for them to have blocking resistance as powder paints, they need to be in solid state at the normal temperature. These resins are, therefore, synthesized with their glass transition points as a reference. When organic solvents have been used in their manufacture, they are used after removing such solvents by methods commonly in use for their removal, i.e., reduced pressure distillation or spray dry process or other methods.

Preferably used as compounds with their number average molecular weights smaller than 1000 and being solid at the normal temperature, which have a plurality of radically polymerizable unsaturated groups are, e.g., condensates of hydroxy-ethyl isocyanurates like tris(2-acryloxy ethyl) isocyanurate and tris(2-methacryloxy ethyl) isocyanurate with acrylic acid or methacrylic acid; compounds derived from isocyanates like reaction products of tolylene diisocyanurate dimer or 4,4'-diphenyl methane diisocyanate with hydroxy ethyl acrylate, hydroxy ethyl methacrylate and so on; condensates of bisphenol A, bisphenol F, polyphenol (novolak base), halogenized bisphenol, etc., with hydroxy ethyl acrylate or hydroxy ethyl methacrylate, etc., and adducts thereto of glycidyl acrylate, glycidyl methacrylate or glycidyl cinnamate, and so on. These compounds meet the indispensable requirement in providing resistance to developers by rapidly cross-linking the parts irradiated by ultraviolet rays for image formation through photobridging reaction. With polymer components only, the exposure efficiency is very low (due to the so-called polymer/polymer reaction), resulting in low sensitivity, but when 10–70 parts by weight of compounds with their molecular weights smaller than 1000 and having a plurality of radically polymerizable unsaturated groups are used, the photopolymerization initiating reaction takes place at high efficiency, yielding photosensitive resins with high sensitivity. If this resin is liquid, blocking resulting from the liquid moving on the powder surfaces with passage of time is unavoidable. Therefore, it needs to be solid. If its amount used is less than 10 parts by weight, the photo-bridging reaction is slow, so that long exposure time is required, and because of inadequate photo-bridging reaction, the part necessary as mask is dissolved out by the developer at the time of development, thus detracting from its due function. Conversely, if its amount is larger than 10 parts by weight, the amount of the resin components which are polymers is small. Consequently, even though the photo-bridging reaction well proceeds, the curing reaction between molecules is less advanced by the aftercuring reaction after the image formation. As a result, its adequate functions are not manifested in heat resistance, plating resistance, flux resistance and durability and so on, which are necessary for a solder mask.

The photopolymerization initiator, one of components required in this process, is not particularly restricted. Any agents being generally in use as photopolymerization initiators for photocuring resins are usable. However, taking account of their usable time as powder paints, those being in solid state at the normal temperature are preferable to those in the liquid state which have a possibility that they might bleed, causing blocking of the powders. Their examples include benzoyl dimethyl ketone, benzophenone, benzoin isopropyl ether, benzoyl dimethyl ketal, 2,2-dimethoxy-2-phenyl acetophenone, etc., but are not necessarily restricted to them. Their mixing rate which is normally employed in the photoinitiation reaction is proper, 0.1–10 parts by weight being optimum, taking account of the efficiency and cost.

These resins, compounds and sensitizers are used in their mixed state. Thus they may be mixed i solid state, after finely comminuted, using a mixer (for example, Hänschel mixer and Supermixer). More preferably, however, various components may be melted and kneaded in an extruder, hot kneader, Banbury mixer and like heater/mixers, and thereafter finely pulverized, yielding powder paints having mean particle sizes of 5–200 μm, preferably 20–100 μm. At this time, the melting temperature must be higher than the softening points and melting points of various components, but lower than their curing temperatures. When any components which are nearly liquid are used, mixing such inorganic fine particles as those of silica together therewith is desirable for prevention of blocking.

Into the composition of this invention, preferably crystalline resins having phase transition temperatures of 60°–120° C. may be compounded as a part of the resin component (i), 5–50 parts by weight of the resin components should desirably be these crystalline resins. More preferably, the crystalline resins should be those having 0.1–3 radically polymerizable unsaturated groups in those with their number average molecular weight of 1000, or further, they may be crystalline resins containing radically polymerizable unsaturated groups which have 0.2–2 curing functional radicals in those with their number average molecular weight of 1000 together therewith.

Powder paints form smooth coating even at every corner, with the substrate held at a temperature above their softening point. They are normally not dissolved in any solvent. Their melt viscosity is higher than liquid pains and their fluidity is not quite high. Accordingly, they are inferior to liquid paints. In order to overcome this difficulty by allowing the paint to enter into every corner of the printed circuits, thereby forming complete coating and make the surface of the coating very smooth, to eliminate scattering and diffusion of light in the exposure step, thereby forming sharp image, such crystalline resins are added. Thus by mixing into the whole powder paint composition, crystalline resins having phase transition temperatures of 60°–120° C., to be 5–50 parts by weight thereof, the melt viscosity of the powder paint is notably reduced at the time of forming its coating, thereby assuring good penetration into the corner parts and very high smoothness of the coating surface. At this time, if the phase transition temperature is lower than 60° C., their blocking resistance as powder paints deteriorate, but if it is higher than 120° C., the melt viscosity of the powders can not be reduced, unless the heating/holding temperature is near the curing temperatures. Then the allowable temperature difference between the formation of coating and the curing under heating almost disappear, causing improper development. If the amount of the crystalline resin is less than 5 parts by weight, the melt viscosity reducing effect at the time of hot melting is small, but if it is in excess of 50 parts by weight, the developability of the unexposed parts is low or the melt viscosity is excessively low, with resultant loss of coating from its sagging at the circuit edge parts, giving rise to its degraded function as a solder mask.

Such crystalline resins are resins having segments which tend to undergo crystal orientation. They may be selected from polyester resins, polycarbonate resins, graft polymerized acrylic resins having crystalline segments in their side chains and like resins. In this instance, the phase transition temperature designates the temperature at which the phase changes from crystal state to liquid state in the heating process. It is indicated by the temperature of the endothermal peak concomitant to melting of crystal on a differential scanning calorimeter (DSC).

As the manufacturing methods of crystalline resins, well-known methods are used. Taking polyester resins as an example, such resins may be readily obtained through esterification or ester exchange reaction from materials having as their indispensable acid components more than one dicarboxylic acid components selected from terephthalic, isophthalic, 1,4-cyclohexane dicarboxylic, 2,6-naphthalene dicarboxylic, 4,4'-biphenyl dicarboxylic acid, their dimethyl esters and acid chloride, etc., and also having as their indispensable glycol components more than one diols selected from straight chain aliphatic diols having 6–18 carbon atoms (e.g., 1,6-hexane diol, 1,8-octane diol, 1,9-nonane diol, 1,10-decane diol, etc.). Besides the aforementioned dicarboxylic acids, they may contain less than 30 mol % of the acid components of such acids as phthalic acid anhydride, hexahydrophthalic acid anhydride, trimellitic acid anhydride, adipic acid, sebacic acid, azelaic acid, etc. If the polyester resins contain more than their 30 mol %, their crystallinity declines, contrary to the purpose.

Similarly, besides the aforementioned diols, less than 20 mol % of polyol components such as diethylene glycol, triethylene glycol, neopentyl glycol, 1,4-cyclohexane dimethanol, 1,4-cyclohexane diol, alkylene oxide adduct of bisphenol A, glycerine, trimethylol propane, trimethylol ethane and pentaerythritol, etc. If polyester resins contain more than 20 mol % of these components, their crystallinity degrades, contrary to the purpose.

By the well-known method of manufacturing polyester resins using these materials, that is, through dehydration/condensation reaction, crystalline polyester resins intended to have are obtained.

Introducing radically polymerizable unsaturated groups into such crystalline resins may be done by reacting them with acrylate or methacrylate base monomers having functional radicals which are capable of reacting with the carboxylic and/or hydroxyl groups left in their molecules, e.g., glycidyl acrylate, glycidyl methacrylate, acryloyl isocyanate, methacryloyl isocyanate, acrylic acid chloride and methacrylic acid chloride, etc. In this instance by using smaller equivalents of compounds having radically polymerizable unsaturated groups which make addition reaction than the total equivalents of the carboxyl and/or hydroxyl groups in the resin substrate, functional radicals which are curing under heating may be left, together with the aforementioned functional groups.

The powder paint compositions used according to this invention have radically polymerizable unsaturated bonds, which are curable by ultraviolet rays, and functional radicals which are curable under heating, into which compositions there may be mixed, as require, photosensitive monomers, fillers, flame retardants and curing accelerators which make curing reaction under heating with the functional groups in the compositions. These compounding agents should desirably in solid state at the normal temperature, but are not bound by this condition. For enhancement of resolution and photosensitivity, sometimes photosensitive monomers which are liquid at the normal temperature are added. Illustrated as such compounds are trimethylol ethane tri(meth)acrylate, trimethylol propane tri(meth)acrylate, pentaerythritol (meth)acrylate, pentaerythritol tetra(meth)acrylate and so on.

The repellency of the powdery particles from the surface of the printed circuit board, when applying any powder paint thereon may be precluded, before applying the powder paint composition on a circuit-board by way of powder coating, by holding beforehand the printed circuit board at a temperature higher than the softening point of the powder paint composition, or putting an organic solvent on the printed circuit board beforehand and then applying the powder paint thereon. In this way, sufficient amount of powder particles for protection of the printed circuit board may be piled one upon another contiguously on its surface and kept in that state. As a consequence, it is possible to form highly coherent coating with an adequate thickness all over the surface of the printed circuit board, whereby a solder mask providing high electrical insulation and having heat resistance and resistance to solvents is obtained.

It should be noted according to this invention, any powder paint composition which normally can not be applied by powder coating on a printed circuit board which normally provides insulation may be held on the surface of the printed circuit board, to permit its proper flow in the later heating process, by preheating the board and/or applying some specified organic solvent thereon. In that way, uniform film thickness may be achieved, without producing sagging as in spray coating liquid on the surfaces of both the insulating substrate and conductors thereon.

DETAILED DESCRIPTION OF THE PREFERRED EMBODIMENTS

In the following, description is taken of this invention in connection with embodiments thereof, but it will not be limited by them in whatever manner. The contacting angles between respective organic solvents on the conductor and the insulating substrate are represented by n 1 and n 2, and the absolute value of the difference between the solubility parameters of the powder paint composition and the aforementioned organic solvent by ΔSP.

SYNTHETIC EXAMPLE 1

1500 parts of xylene and 500 parts of cyclohexanone were put in a reaction apparatus equipped with a thermometer, condenser, nitrogen inlet pipe and stirring vanes and the temperature of the system was raised to 140° C. Then a mixed solution of 1370 parts of methyl methacrylate, 520 parts of glycidyl methacrylate, 110 parts of n-butyl acrylate and 80 parts of t-butyl-2-ethyl hexanoate was dropwise added, taking 3 hr. After holding this mixture at this temperature for 30 min, following the completion of this addition, a solution of t-butyl-2-ethyl hexanoate in 40 parts of cyclohexanone was dropped in 30 min. The mixture was held at this temperature for 150 min and then cooled down to 120° C. After replacing the gas to be introduced from nitrogen to oxygen, a solution of 1 part of hydroquinone in 10 parts of cyclohexanone was added and then the reaction was continued at this temperature, while dropping 132 parts of acrylic acid in about 20 min. As the acid value of the system came to below 0.5, the reaction was terminated by cooling it down. This resin varnish was spray-dried by use of a spray drier, yielding an acrylic resin with a molecular weight of 3500, which has acryloyl and glycidyl radicals.

SYNTHETIC EXAMPLE 2

1500 parts of xylene and 500 parts of cyclohexanone were put into the same reaction apparatus as in Synthetic Example 1 and the temperature of the system was raised to 140° C. Then a mixed solution of 1280 parts of methyl methacrylate, 380 parts of n-butyl acrylate, 340 parts of methacrylate and 80 parts of t-butyl-2-ethyl hexanoate was dropwise added, taking 3 hr. After holding the system at this temperature for 30 min, following the completion of this addition, a solution 20 parts of t-butyl-2-ethyl hexanoate in 40 parts of cyclohexanone was dropped in 30 min. The system was then held at this temperature for 150 min and then cooled down to 120° C. After replacing the gas to be filled therein from nitrogen to oxygen, a solution of 1 part of hydroquinone in 10 parts of cyclohexanone was added and thereafter, the reaction was continued at this temperature, while dropping 280 parts of glycidyl methacrylate thereinto in about 20 min. This resin varnish was spray-dried, using a spray drier, yielding an acrylic resin with a molecular weight of 3800, which has methacryloyl and carboxyl groups.

SYNTHETIC EXAMPLE 4

Into the same reaction apparatus as used in Synthetic Example 1, 3800 parts of epoxy resin of bisphenol A epichlorohydrin type with an epoxy equivalent of 1900 and 4000 parts of toluene were put and the resin was dissolved. Subsequently, 60 parts of triphenyl phosphine as a catalyst and 20 parts of hydroquinone as thermal polymerization inhibitor were added and further, 72 parts of acrylic acid was dropped, to perform reaction with the epoxy resin at 100° C. for 5 hr, thereby acrylating it. After the product was cooled down, it was spray dried, using a spray drier, yielding epoxy acrylate with a molecular weight of 4000 and having acryloyl and epoxy radicals.

SYNTHETIC EXAMPLE 5

Into the reaction apparatus used in Synthetic Example 1 plus a decanter, 1280 parts of dimethyl terephthalate, 300 parts of 1,4-cyclohexane dimethanol, 510 parts of neopentyl glycol, 90 parts of trimethylol propane and 1 part of dibutyl tin oxide were put and reacted, while demethanoling at 200°–210° C. After stopping the reaction, to have an acid value of the resin of 10, the system was cooled down and addition reaction was further continued at a reaction temperature of 150°–180° C., with 250 parts of phthalic acid anhydride added. Then upon confirming that the acid value of the resin had reached 50, the reaction was brought to an end. After forming a homogeneous solution with addition of 1500 parts of butyl acetate, 360 parts of and adduct obtained by reaction of 1 mol of isophorone diisocyanate with 1 mol of 2-hydroxy ethyl acrylate was added to the solution, to react therewith. After completion of the reaction, the product was spray-dried, using a spray drier, yielding a polyester resin with a molecular weight of 2100 and having acryloyl and carboxyl groups.

SYNTHETIC EXAMPLE 6

In the same way as in Synthetic Example 5, 192 parts of dimethyl terephthalate, 140 parts of 1,6-hexane diol and 0.8 part of dibutyl tin oxide were charged into a reaction apparatus. Then the temperature of the system was raised to 210° C., while taking the methanol formed out of the system. At this temperature, pressure reduction was made to begin. Then at 10 mmHg, the reaction was continued for 1 hr, followed by cooling. The molecular weight of this resin was 750 and its phase transition temperature was 115° C., as indicated by the temperature of the endothermal peak concomitant with the melting of crystal at the time of measurement with DSC.

SYNTHETIC EXAMPLE 7

In the same way as in Synthetic Example 5, 190 parts of dimethyl terephthalate, 1,10-decane diol, 26.8 parts of trimethylol propane and 0.8 part of dibutyl tin oxide were charged into a reaction apparatus. The temperature of the system was gradually raised up to 210° C., while taking the methanol formed out of the system, and it was further elevated to 220° C., taking 3 hr, after adding 38.5 parts of phthalic acid anhydride. The reaction was continued at this temperature and the reaction was terminated, upon reaching an acid value of 90. After cooling, 0.8 part of tetrabutyl ammonium chloride was charged into the apparatus and with 80 parts of glycidyl cinnamate added, while stirring at 110° C., the reaction was run, until the epoxy equivalent had reached 30000. By drying the product under a reduced pressure a crystalline polyester resin having a cinnamoyl and carboxyl groups, which gave its phase transition temperature at 80° C. was obtained. Its molecular weight was 2150.

SYNTHETIC EXAMPLE 8

In the same reaction apparatus as used in Synthetic Example 1, 1500 parts of xylene and 500 parts of cyclohexanone were put and the temperature of the system was raised up to 140° C. Then a mixed solution of 1180 parts of methyl methacrylate, 200 parts of n-butyl acrylate and 840 parts of methacrylic acid, 280 of hydroxyethyl methacrylate and 80 parts of t-butyl-2-ethyl hexanoate was added dropwise, taking 3 hr. After holding the system at this temperature for 30 min, following the termination of the dropwise addition, a liquid having 20 parts of t-butyl-2-ethyl hexanoate dissolved in 40 parts of cyclohexanone was dropped in 30 min. The system was held at this temperature for 150 min and then cooled down to 120° C. Then after changing the gas to be filled in from nitrogen to oxygen, a liquid having 1 part of hydroquinone dissolved in 10 parts of cyclohexanone was added. Thereafter, the reaction was continued at this temperature, while dropwise adding 280 parts of glycidyl methacrylate in about 20 min. The epoxy equivalent of the product was continuously measured, until it had exceeded 30000, and thereupon the reaction was terminated by cooling. This resin varnish was spray-dried, using a spray drier, yielding an acrylic resin with a molecular weight of 3300 and having methacryloyl, carboxyl and hydroxyl groups.

EXAMPLE 1

Thirty parts of the photosensitive resin obtained in Synthetic Example 1 and 30 parts of the photosensitive resin obtained in Synthetic Example 2, 40 parts of tris(2-acryloxyethyl)isocyanurate, 3 parts of benzoyl dimethyl ketone and 0.5 part of a green pigment were premixed. Thereafter, the mixture was kneaded by passing through a Busco kneader (manufactured by Busu Co.) where the temperature was set at 120° C. The kneaded mixture was finely comminuted by an atomizer, and screened through a 200 mesh sieve, yielding a 25–50 $\mu$m powdery resin composition. This composition was simultaneously applied on both surfaces of the through-holed printed copper circuit board which had been preheated to 110° C. When its coating was formed by holding this printed circuit at 110° C. for 10 min, a photosensitive coating which was not sticky was obtained. The film thickness of this coating on the flat substrate part was 60 $\mu$m. After exposing it for image formation to a quantity of light of 550 mj/cm$^2$ from an ultrahigh voltage mercury lamp, the latent image was developed for 1 min, using trichloroethane. The inside of the through-hole was a perfect cavity, attesting to impeccable development. The developed image was heated at 140° C. for 50 min, after dried, thereby forming a solder mask. The solder mask on this printed circuit board was smooth, showing no spotty coating, but covering the circuit board with an adequate thickness. Thus on the 50 $\mu$m high circuit, it has a thickness of 50 $\mu$m, and on each edge part of the circuit 45 $\mu$m, and it was not stripped off, even after dipped in a molten solder at 260° C. It did show no change on its surface, even after dipped for 1 hr in trichloroethylene, 10% sulfuric acid or 5% sodium hydroxide.

EXAMPLE 2

A powdery resin was obtained in the same way in Example 1 form 75 parts of the photosensitive resin obtained in Synthetic Example 3, 5 parts of dicyandiamide, 20 parts of bisphenol A dimethacrylate, 5 parts of benzophenone and 0.5 part of green pigment. By applying the resin in the same way as in Example 1, a printed circuit board having a photosensitive coating applied on a through-holed copper board with a film thickness of 50 $\mu$m on a flat part of substrate. After exposing the coating for image formation with a quantity light of 600 mj/cm$^2$ from an ultrahigh voltage mercury lamp, the latent image was developed for 1 min. The inside of the through-hole was a perfect cavity, attesting to impeccable development. A mask was then obtained by heating the developed image at 140° C. of 40 min, after its drying. The solder mask on the printed circuit was smooth, showing no spotty coating, and covering the circuit with an adequate thickness. Thus its thickness was 45 $\mu$m on the 50 $\mu$m high circuit, and 40 $\mu$m on each edge part of the circuit. It did not peel off the board, even after dipped in a molten solder. Moreover, no change was observed on its surface, even after dipped for 1 hr in trichloroethylene, 10% sulfuric acid or 5% sodium hydroxide.

EXAMPLE 3

A powdery resin was obtained by the same manufacturing method as used in Example 1 from 50 parts of the photosensitive resin obtained in Synthetic Example 5, 20 parts of Epoxy VR-90 (epoxyacrylate with a molecular weight of 1100 and having acryloyl groups at both ends, manufactured by Showa Kobunshi K.K.), 20 parts of tris(2-acryloxyethyl) isocyanurate, 10 parts of novolak type epoxy with an epoxy equivalent of 150 and a molecular weight of 600, 5 parts of benzoyl dimethyl ketal and 0.5 part of a green pigment. By applying this resin on a through-holed copper board similarly as in Example 1, a printed circuit board provided with a photosensitive coating having a film thickness of 45 $\mu$m at the flat part of the substrate was obtained. After exposing for image formation the printed circuit board to a quantity of light of 400 mj/cm$^2$ from an ultrahigh voltage mercury lamp through a pattern mask placed out of touch therewith, while holding it at 90° C., the latent image was developed for 1 min, using trichloroethane. The insides of the through-holes were perfect cavities, thus attesting to impeccable development. After drying the board, a solder mask was formed by heating it at 140° C. for 40 min. The solder mask on the printed circuit board was smooth, showing no spotty coating, and covering the circuits with an adequate thickness. Thus its thickness was 45 $\mu$m on the 70 $\mu$m high circuits, and 35 $\mu$m on each edge part of the circuits. It did not peel off after dipped in a molten solder at 260° C. No change was observed on its surface, even after dipped for 1 hr in trichloroethylene, 10% sulfuric acid or 5% sodium hydroxide.

EXAMPLE 4

A powdery resin was obtained by the same manufacturing method as used in Example 1 from 40 parts of the photosensitive resin obtained in Synthetic Example 8, 45 parts of bisphenol A diethylene glycol diacrylate, 15 parts of methyl ethyl ketoneoxime blocked trimethylol propane triisophorone diisocyanate, 6 parts of benzophenone and 0.5 part of a green pigment. By applying this resin on a through-holed copper plate similarly as in Example 1, a printed circuit board coated with a photosensitive film 40 $\mu$m thick on the flat parts of the substrate was formed thereon. The inside of each through-hole was a perfect cavity, thus attesting to impeccable development. By heating the board at 150° C. for 30 min, after drying, a solder mask was obtained. The solder mask obtained in this way was found smooth, showing no spotty coating and covering the circuits with an adequate thickness. Thus its thickness was 40 $\mu$m on the 40 $\mu$m high circuits, and 35 $\mu$m on each edge part of the circuits. It did not peel, even after dipped in a molten solder at 260° C. Further, no change was observed on its surface, after dipped for 1 hr in trichloroethylene, 10% sulfuric acid or 5% sodium hydroxide.

EXAMPLE 5

Fifty five parts of the photosensitive resin obtained in Synthetic Example 4, 30 parts of tris(2-acryloxyethyl)isocyanurate, 15 parts of triglycidyl tris(hydroxyethyl)isocyanurate, 4 parts of hydroxycyclohexyl phenyl ketone and 0.5 part of a green pigment were kneaded by passing through a Busco kneader (manufactured by Busco Co.) which was set to 110° C., after premixing them. Then silicon oxide powders were sprinkled on the surface of the effluent resin composition at the rate of 0.2% by weight. It was finely comminuted by an atomizer The kneaded mixture was finely comminuted by an atomizer and then screened by a 200 sieve, mesh yielding a 25–50 $\mu$m powdery resin composition. This product was applied by use of an electrostatic powder coater simultaneously on both surfaces of the through-holed printed copper circuit board which had been preheated to 1000° C. By holding this printed circuit board at 110° C. for min, to form a film, a non-sticky photosensitive coating was obtained. This coating had a film thickness of 60 $\mu$m at the flat part of the substrate. After exposing it for image formation to a quantity of light of 500 mj/cm$^2$ from an ultrahigh voltage mercury lamp, the latent image was developed for about 1 min, using 1% sodium carbonate. The inside of each through hole was a perfect cavity, thus attesting to impeccable development. A solder mask was then obtained by heating the board at 150° C. for 30 min, after drying. The solder mask on the circuit board thus obtained was found smooth, showing no spotty coating and covering the circuits with adequate thicknesses. Thus its thickness was 50 $\mu$m on the 60 $\mu$m high circuits, and 45 $\mu$m on each edge part of the circuits, and it did not peel, even after dipped in a molten solder at 260° C. Further, no change was observed on its surface, even after its dipping for 1 hr in trichloroethylene, 10% sulfuric acid or 5% sodium hydroxide.

EXAMPLE 6

A powdery resin composition was obtained under exactly the same conditions as in Example 2, except that 20 parts of the crystalline resin obtained in Synthetic Example 6 was added to 100 parts of the composition composing Example 2. By applying the composition on a through-holed board similarly as in Example 1, followed by quenching, a printed circuit board provided with a photosensitive coating thereon with a 40 $\mu$m film thickness at flat parts of the substrate. This coating had a mirror surface. After exposing it for image formation to a quantity of light of 700 mj/cm$^2$ from an ultrahigh voltage mercury lamp, the latent image was developed in 1 min, using trichloroethane. The inside of each through hole was a perfect cavity, thus attesting to impeccable development. Then by heating it at 140° C. for 40 min after drying, a solder mask was obtained. The solder mask on the printed circuit board thus obtained was found adequately smooth, showing no spotty coating, and covering the circuits with proper thicknesses. Thus its thickness was 40 $\mu$m on the 50 $\mu$m high circuits, 35 $\mu$m on each edge of the circuits and it did not peel even after dipped in a molten solder at 260° C. Further, no change was observed on its surface, even after dipped for 1 hr in trichloroethylene, 10% sulfuric acid or 5% sodium hydroxide.

EXAMPLE 7

A powdery resin composition was obtained under exactly the same conditions as in Example 3, except that 35 parts of the crystalline resin obtained in Synthetic Example 7 was added to 100 parts of the composition which constitutes Example 3. After applying this composition on the printed circuit board similarly as in Example 1, it was exposed for image for formation to a quantity of light of 400 mj/cm$^2$ from an ultrahigh voltage mercury lamp, while holding it at 30° C. Thereafter, the latent image was developed for 1 min, using trichloroethane. The inside of each through hole was a perfect cavity, thus attesting to impeccable development. Then by heating the board at 140° C. for 30 min after drying, a solder mask was obtained. The solder mask on the printed circuit board thus obtained was found adequately smooth, having a mirror surface and covering the circuits with proper thicknesses. Thus its thickness was 45 μm at flat parts of the substrate, 40 μm on the 60 μm high circuits, and 35 μm on each edge of the circuits. It did not peel, even after dipped in a molten solder at 260° C. Further, no change was observed on its surface after its dipping for 1 hr in trichloroethylene, 10% sulfuric acid or 5% sodium hydroxide.

EXAMPLE 8

Seventy five parts of a photosensitive epoxy resin having glycidyl groups, which is solid at the room temperature, 5 parts of dicyanediamide, 20 parts of bisphenol A dimethacrylate, 5 parts of benzophenone and 0.5 part of a green pigment were kneaded by passing them, after premixing, through a Busco kneader (manufactured by Busu Co.) which was set at 120° C. This kneaded mixture was finely communicated by an atomizer and the fine powders were screened by a 200 mesh sieve, yielding a 25-50 μm powder paint composition. On both surfaces of the printed circuit board having copper foil circuits on an insulating board of glass epoxy, ethylene glycol monoethyl ether acetate was coated by a roll coater. At this time the SP value was 2, 8.5, and 12.5. In the state that the printed circuit-board was held at 80 F. and that 200 mg/dm² of the organic solvent was left coated on the surface of the printed circuit board, the powder paint composition prepared as hereabove described was applied on both surfaces simultaneously, using a powder coater.

The solder mask thus formed on the printed circuit-board was smooth, showing no spotty coating, bubble free, and covering the circuits and each corner of the circuits with proper thickness. Thus its thickness was 35 μm on the 50 μm high circuits, and 25 μm on each edge of the circuits. A subsequent visual test of the substrate revealed no peeling of it at all, even after its dipping in a molten solder at 260° C. Further, it showed no change on its surface, after dipped for 1 hr in trichloroethylene, 10% sulfuric acid or 5% sodium hydroxide.

EXAMPLE 9

A solder mask was obtained similarly as in Example 1, except that toluene was used in place of ethylene glycol monoethyl ether acetate and that the powder paint composition was applied by use if a powder sprayer in the state of 500 mg/dm² of the organic solvent being left. At this time, the ΔSP value was 2.5, n 1 was 6.4, and n 2 was 9.7.

The solder mask thus formed on the printed circuit board was smooth, having no spotty coating, free of bubbles and covering the circuits and each corner of the circuits with proper thickness. Thus its thickness was 35 μm on 50 μm high circuits, and 25 μm on each edge of the circuits. A subsequent visual test on the substrate revealed no peeling of it at all, even after its dipping in molten solder at 260° C. Further, it showed no changed on its surface, even after dipped for 1 hr in trichloroethylene, 10% sulfuric acid or 5% sodium hydroxide.

EXAMPLE 10

A solder mask was formed similarly as in Example 1, except that a powder paint composition consisting of 80 parts of epoxy acrylate with an acid value of 80 and having carboxyl groups, 15 parts of triglycidyl tris(hydroxyethyl) isocyanurate, 5 parts of dicyandiamide, 10 parts of methyl ethyl ketone oxime blocked trimethylol propane tritoluene diisocyanate, 5 parts of benzophenone and 0.5 part of a green pigment was used in place of the powder paint composition of Example 8, that this powder paint composition was sprayed by use of a powder sprayer in the state of 500 mg/dm² of the organic solvent being left on the board, that use was of the fluidized dipping method as a powder coating method and that 1% sodium carbonate was used as the developer. At this time, ΔSP value was 2.1, n 1 was 12.0, and n 2 was 15.3.

The solder mask thus formed on the printed circuit board was smooth, having no spotty coating, free of bubbles, and covering the circuits and each corner part of the circuits with proper thickness. Thus its film thickness was 50 μm on flat parts of the substrate, and 35 μm on each edge part of the 50 μm high circuits. A subsequent visual test on the substrate revealed no peeling of it at all, after its dipping in molten solder at 200° Further, it showed no change on its surface, after dipped for 1 hr in trichloroethylene, 10% sulfuric acid or 5% sodium hydroxide.

COMPARATIVE EXAMPLE 1

Fifty parts of the photosensitive resin of Synthetic Example 1, 50 parts of the photosensitive resin of Synthetic Example 2, 3 parts of benzoyl dimethyl ketone and 0.5 par of a green paint, excluding from the powdery resin constituting components used in Example 1 a compound with a molecular weight smaller than 1000 and having a plurality of polymerizable unsaturated groups or tris(2-acryloxyethyl)isocyanurate, were premixed, then, melted and kneaded, using a Busco kneader which was set to 120° C. The kneaded mixture was finely comminuted by an atomizer and the fine powders thus obtained were screened through a 200 mesh sieve, yielding a 25-50 μm powdery resin composition. This composition was applied simultaneously on both surfaces of a through-holed printed copper wiring board which was preheated to 110° C. Its film was formed by holding this printed circuit board at 110° C. for 10 min. It was a nonsticking photosensitive coating, but the coating surface was notably round. The film thickness of the coating on flat parts of the substrate was 60 μm. After exposing this coating for image formation to a quantity of light of 800 mj/cm² from an ultrahigh voltage mercury lamp, the latent image thus formed was developed for 1 min., using trichloroethane. This board was heated at 140° C. for 50 min. after dried, yielding a solder mask, but the developer did not well drain from the image part, causing its partial dissolution. The circuits were not covered by proper thickness of the solder mask on the printed circuit board. Its thickness was 15-40 μm on 50 μm high circuits and 5-35 μm on each edge part of the circuits and part of it was sometimes peeled after its dipping in molten solder at 260° C. Further, after dipping it for 1 hr in trichloroethylene, 10% sulfuric acid or 5% sodium hydroxide, its surface manifested abnormality, with part of circuits disconnected.

COMPARATIVE EXAMPLE 2

When the powdery resin composition prepared in Example 1 was tried to be applied, without preheating the printed circuit board in applying it by use of an electrostatic coater, no coating was applied on the insulating layer due to the induced electrostatic repellency.

COMPARATIVE EXAMPLE 3

A photosensitive paint solution was produced from the resin varnish synthesized in Synthetic Example 1 and 2, without drying and at exactly the same solid content ratio as in Example 1. This solution was diluted with ethylene glycol monoethyl ether acetate to its sprayable viscosity, for it to be applied by spraying. The coating solution thus prepared was applied on a through-holed printed copper wiring board which had been preheated to 60° C. After holding the printed circuit board at 80° C. for 10 min., to vaporize the solvent, thereby forming a contiguous film, the other side was similarly coated. As the film was formed at 110° C., taking 10 min., after holding the board at 80° C. for 10 min. after its coating, the film thus formed was a non-sticking and smooth photosensitive coating. This coating had film thickness of 20–50 μm on flat parts of the substrate. After exposing the coating for image formation to a quantity of light of 600 mj/cm$^2$ from an ultra-high mercury lamp, the latent image thus formed was developed, using trichloroethylene, but resist films inside the through holes could not be completely removed. In order to completely remove them, the development was continued further for about 1 min. and the board was heated at 140° C. for 40 min., yielding a solder mask. The solder mask thus formed on the printed circuit board manifested paint sagging phenomenon. Its thickness was 10–20 μm on 50 μm high circuits and 5–10 μm on each edge part of the circuits and it sometimes partly peeled, after dipped in molten solder at 260° C. Further, after dipping it for 1 hr in trichloroethylene, 10% sulfuric acid, or 5% sodium hydroxide, abnormality was recognized on its surface, with part of the circuits being disconnected.

COMPARATIVE EXAMPLE 4

When the powder paint composition of Example 8 was applied by spraying it on a printed circuit board, without putting any organic solvent thereon, it was not fixedly coated on the printed circuit board.

COMPARATIVE EXAMPLE 5

A solder mask was formed similarly as in Example 8, except that n-octane was used in place of ethylene glycol monoethyl ether-acetate and that the powder paint composition was applied by use of a powder sprayer with the circuit board being in the state of 500 mg/dm$^2$ of the organic solvent being left thereon. At this time, ΔSP value was 4.0, n 1 was 5.01, and n 2 was 7.8.

The solder mask thus formed on the printed circuit board had thin film thickness, spotty coating and bubbles remaining in the coating. The coating had a film thickness of 10–30 μm in flat parts of the substrate. Its thickness was 5–15 μm on 50 μm high circuits and less than 10 μm on each edge of the circuits and it partially peeled, after dipped in molten solder at 260° C. Further, abnormality was observed on its surface, with circuits being disconnected at many parts, after its dipping for 1 hr in trichloroethylene, 10% sulfuric acid or 5% sodium hydroxide.

REFERENCE EXAMPLE 1

A solder mask was formed similarly as in Example 8, except that use was made of a 10% by weight concentration of a primer prepared by diluting trichloroethane bisphenol A type epoxy resin with an epoxy equivalent of 190 in place of ethylene glycol monoethyl ether acetate and that the aforementioned powder paint composition was applied by spraying in the state of 400 mg/dm$^2$ (approx. 3) of the primer being left (in accordance with the description in Example 1 of Japanese Patent Laid-Open Publication No. SHO 59-189968).

The solder mask thus formed on the printed circuit board had a film thickness of the coating of approx. 50 μm on flat parts of the substrate, its thickness being 35 μm on 50 μm high circuits and 30 μm on each edge of the circuits. At the borders of the developed parts, however, there was a tendency of the contacting part between the bottom and the substrate being carved or a undercutting phenomenon. When it was brought under air blow, the resist film was peeled at one part. It sometimes peeled off at some part after dipped in molten solder at 260° C., Swelled surface was observed after its dipping in trichloroethylene, 10% sulfuric acid or 5% sodium hydroxide, and the circuits were found disconnected at many parts.

A method of forming a solder mask has been provided which enables forming a coating with uniform thickness and highly cohesive to the overall surface of a printed circuit-board.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A method of forming a solder mask on printed circuit boards, using powder paint which is curable by both irradiation of ultraviolet rays and heat, comprising:
   (1) a step of coating the powder paint on a printed circuit board, while holding it at a temperature higher than a softening point of the powder paint but lower than its curing temperature,
   (2) a step of irradiating ultraviolet rays thereon through a pattern mask,
   (3) a step of making development with a medium which dissolves the region not irradiated by ultraviolet rays and,
   (4) a step of completely curing the coating part developed on the printed circuit board at a temperature higher than the curing temperature of the powder paint, wherein said powder paint comprises:
   (i) 30–90 parts by weight of a resin with its number average molecular weight larger than 1000 and being in solid state at the normal temperature, which has 0.1–3 radically polymerizable unsaturated groups and 0.1–5 functional groups which undergo self-setting reaction or react with other functional groups under heating in molecules having a 1000 number average molecular weight,
   (ii) 70–10 parts by weight of compounds with their number average molecular weight smaller than 1000 and being in solid state at the normal temperature, which have a plurality of radically polymerizable unsaturated groups and
   (iii) 0.1–10 parts by weight of photopolymerization initiator in proportion to 100 parts by weight of the sum of the components (i) and (ii) mixed therewith, and
   wherein a crystalline resin having a phase transition temperature of 60°–120° C. is used as part of the resin of the component (i).

2. The method according to claim 1, wherein in the step of irradiating ultraviolet rays through a pattern mask, ultraviolet rays are irradiated on the printed circuit board, without allowing the pattern mask to be in contact with the printed circuit board, while holding it at a temperature higher than the softening point of said powdery paint but lower than its curing temperature.

3. The method according to claim 1 wherein after finishing the step (1), the powder paint on the printed circuit board is made into a continuous coating by controlling the temperature of the printed circuit board to a temperature higher than a softening point of the powder paint but lower than its curing temperature.

4. The method according to claim 1 wherein, after finishing the step (1), the printed circuit board having the powder coating layer is quenched.

5. A method of forming a solder mask on printed circuit boards using powder paint which is curable by both irradiation of ultraviolet rays and heat, comprising:
   (1-a) a step of putting on a printed circuit board 1–1000 mg/dm$^2$ of an organic solvent whose contact angle with the conductor and the insulating substrate is smaller than 20 degrees,
   (1-b) a step of coating on a printed circuit board having the organic solvent the powder paint which gives an SP value less than 3 between it and the organic solvent,
   (2) a step of irradiating ultraviolet rays thereon through a pattern mask,
   (3) a step of making development with a medium which dissolves the region not irradiated by ultraviolet rays and,
   (4) a step of completely curing the coating part developed on the printed circuit board at a temperature higher than the curing temperature of the powder paint.

6. The method according to claim 5 wherein after finishing the step (1-b), the powder paint on the printed circuit board is made into a continuous coating by controlling the temperature of the printed circuit board to a temperature higher than a softening point of the powder paint but lower than its curing temperature.

7. The method according to claim 5 wherein in the step (1-b), coating is conducted at a temperature of 5° to 90° C.

8. The method according to claim 7 wherein, after finishing the step (1-b), the printed circuit board having the powder coating layer is quenched.

9. The method according to claim 5 wherein said powder paint comprises (i) 30–90 parts by weight of a resin with its number average molecular weight larger than 1000 and being in solid state at the normal temperature, which has 0.1–3 radically polymerizable unsaturated groups and 0.1–5 functional groups which undergo self-setting reaction or react with other functional groups under heating in molecules having a 1000 number average molecular weight, (ii) 70–10 parts by weight of compounds with their number average molecular weight smaller than 1000 and being in solid state at the normal temperature, which have a plurality of radically polymerizable unsaturated groups and (ii) 0.1–10 parts by weight of photopolymerization initiator in proportion to 100 parts by weight of the sum of the components (i) and (ii) mixed therewith.

10. The method according to claim 9 wherein a crystalline resin having a phase transition temperature of 60°–120° C. is used as part of the resin of the component (1).

* * * * *